(12) United States Patent
Yoon

(10) Patent No.: US 11,800,659 B2
(45) Date of Patent: Oct. 24, 2023

(54) DISPLAY DEVICE

(71) Applicant: LG DISPLAY CO., LTD., Seoul (KR)

(72) Inventor: Sangwon Yoon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/505,206

(22) Filed: Oct. 19, 2021

(65) Prior Publication Data

US 2022/0141978 A1 May 5, 2022

(30) Foreign Application Priority Data

Nov. 2, 2020 (KR) ........................ 10-2020-0144190

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .............................. H05K 5/0217; G06F 1/1652
See application file for complete search history.

(56) References Cited

U.S. PATENT DOCUMENTS

| | | | | |
|---|---|---|---|---|
| 8,009,422 B2* | 8/2011 | Misawa | ............ | G02F 1/133308 345/157 |
| 8,654,519 B2* | 2/2014 | Visser | ..................... | G09F 11/30 361/679.21 |
| 9,772,657 B2* | 9/2017 | Takayanagi | ......... | H04M 1/0268 |
| 10,684,652 B2* | 6/2020 | Kim | .................. | G02F 1/133528 |
| 11,294,424 B2* | 4/2022 | Shai | ....................... | G06F 3/0412 |
| 2004/0183958 A1* | 9/2004 | Akiyama | .................. | G09F 9/30 349/58 |
| 2006/0126287 A1* | 6/2006 | Lin | ..................... | G06F 3/03545 361/679.56 |
| 2010/0246113 A1* | 9/2010 | Visser | ................. | H04M 1/0268 361/679.3 |
| 2011/0043976 A1* | 2/2011 | Visser | .................... | G09F 9/301 361/679.01 |
| 2011/0273826 A1* | 11/2011 | Misawa | ................... | G09F 11/02 361/679.01 |
| 2015/0062840 A1* | 3/2015 | Kim | ..................... | H05K 5/0217 361/749 |
| 2017/0156219 A1* | 6/2017 | Heo | ........................ | G09F 9/301 |
| 2018/0160554 A1* | 6/2018 | Kang | ................. | H01L 51/5237 |

(Continued)

FOREIGN PATENT DOCUMENTS

KR 10-2001-0101084 A 11/2001
KR 10-2019-0124410 A 11/2019

*Primary Examiner* — Sagar Shrestha
(74) *Attorney, Agent, or Firm* — POLSINELLI PC

(57) ABSTRACT

A display device according to an exemplary aspect of the present disclosure may include a display panel including a non-display area, a back cover supporting the display panel on one surface of the display panel, a roller for winding or unwinding the display panel and the back cover and side covers covering a portion of the non-display area of the display panel and a portion of a side surface of the back cover corresponding thereto, and including a plurality of unit side covers to thereby support the non-display area of the display panel when the roller is wound. Thus, stress generated during rolling can be reduced and accordingly, it is possible to prevent cracks and damage to the GIP unit.

19 Claims, 18 Drawing Sheets

(56) References Cited

U.S. PATENT DOCUMENTS

2018/0182838 A1\* 6/2018 Yeo .................... H01L 51/5253
2019/0064881 A1\* 2/2019 Kim .................... G06F 1/1652
2019/0165300 A1\* 5/2019 Lee .................... H01L 51/5253
2019/0198783 A1\* 6/2019 Kim .................... H01L 51/0097
2022/0189350 A1\* 6/2022 Lee ....................... G09F 9/301

\* cited by examiner

DISPLAY DEVICE

CROSS-REFERENCE TO RELATED APPLICATION

This application claims the benefit of and priority to Korean Patent Application No. 10-2020-0144190 filed on Nov. 2, 2020, which is hereby incorporated by reference in its entirety.

BACKGROUND

Field of the Disclosure

The present disclosure relates to a display device, and more particularly, to a display device capable of displaying an image even when the display device is rolled.

Description of the Background

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only a computer monitor and a TV, but personal mobile devices, and thus, display devices having a reduced volume and weight while having a wide display area are being studied.

Recently, a flexible display device manufactured to be able to display an image even when the display device is rolled, by forming a display element, lines and the like on a flexible substrate, such as plastic which is a flexible material, has received considerable attraction as a next-generation display device.

SUMMARY

Accordingly, the present disclosure is to provide a display device capable of preventing cracks in a gate in panel (GIP) unit caused by repeated rolling.

The present disclosure is not limited to the above-mentioned and other features, which are not mentioned above, can be clearly understood by those skilled in the art from the following descriptions.

A display device according to an exemplary aspect of the present disclosure may include a display panel including a non-display area, a back cover supporting the display panel on one surface of the display panel, a roller for winding or unwinding the display panel and the back cover and side covers covering a portion of the non-display area of the display panel and a portion of a side surface of the back cover corresponding thereto, and including a plurality of unit side covers to thereby support the non-display area of the display panel when the roller is wound.

Other detailed matters of the exemplary aspects are included in the detailed description and the drawings, According to the present disclosure, stress generated during rolling can be reduced by fastening the side covers to side surfaces of the display panel that contacts a low-curvature contact portion of the roller to support the display panel.

Accordingly, it is possible to prevent cracks and damage to the GIP unit, thereby solving driving failure and reliability defects of the display panel.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1A:
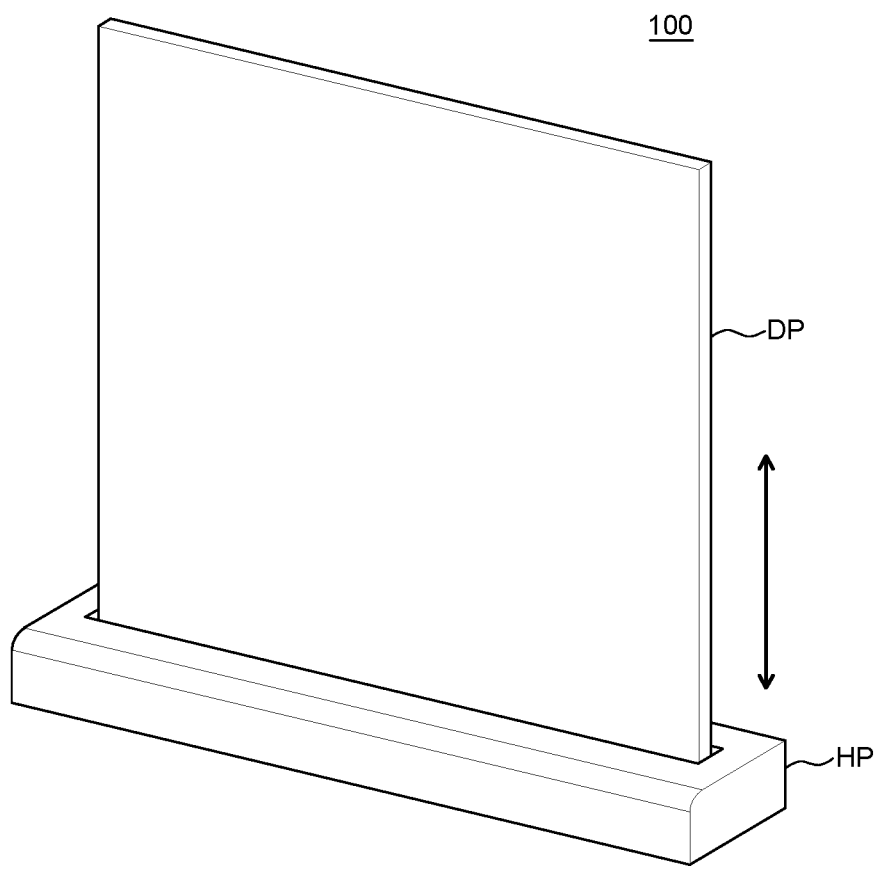
FIG. 1A and FIG. 1B are perspective views of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, exemplary aspects of the present disclosure will be described in detail with reference to accompanying drawings.

A rollable display apparatus may also be referred to as a display apparatus which is capable of displaying images even though the display apparatus is rolled. The rollable display apparatus may have a high flexibility as compared with a general display apparatus of the related art. Depending on whether to use a rollable display apparatus, a shape of the rollable display apparatus may freely vary. Specifically, when the rollable display apparatus is not used, the rollable display apparatus is rolled to be stored with a reduced volume. In contrast, when the rollable display apparatus is used, the rolled rollable display apparatus is unrolled to be used.

Figure 1B:
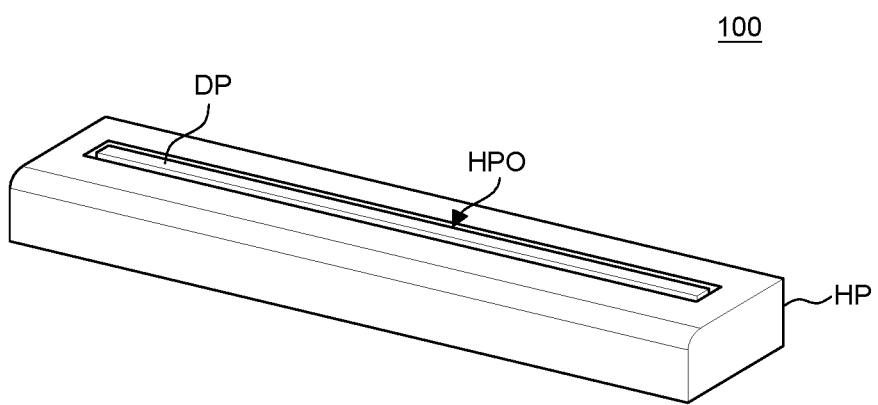

FIG. 1A and FIG. 1B are perspective views of a display device according to an exemplary aspect of the present disclosure.

With reference to FIG. 1A and FIG. 1B, a display device 100 according to an exemplary aspect of the present disclosure may include a display part DP and a housing part HP.

The display part DP is a component for displaying images to a user. For example, display elements, circuits for driving the display elements, lines, and other components may be disposed in the display part DP.

Since the display device 100 according to an exemplary aspect of the present disclosure is a rollable display device, the display part DP may be configured to be wound or unwound. The display part DP may be formed of a display panel and a back cover that have flexibility so that they can be wound or unwound. A more detailed description of the display part DP will be described later with reference to FIGS. 2 to 4.

The housing part HP serves as a case where the display part DP can be accommodated. The display part DP may be wound and accommodated within the housing part HP, and the display part DP may be unwound and may be disposed outside the housing part HP.

The housing part HP has an opening HPO disposed therein so that the display part DP may move into and out of the housing part HP. The display part DP may move through the opening HPO of the housing part HP in a vertical direction.

Meanwhile, the display part DP may be switched from a fully unwound state to a fully wound state or from the fully wound state to the fully unwound state.

In this case, FIG. 1A illustrates a fully unwound state of the display part DP of the display device 100. The fully unwound state refers to a state in which the display part DP of the display device 100 is disposed outside the housing part HP. That is, the fully unwound state can be defined as a state, in which the display part DP is unwound and disposed maximally outside the housing part HP in order for a user to view images through the display device 100 and the display part DP can no longer be unwound.

In addition, FIG. 1B illustrates a fully wound state of the display part DP of the display device 100. The fully wound state refers to a state in which the display part DP of the display device 100 is fully wound and accommodated within the housing part HP and can no longer be wound. That is, the fully wound state can be defined as a state in which the display part DP is wound to be accommodated within the housing part HP since dispose the display part DP may not be disposed outside the housing part HP in terms of an external appearance when a user does not view images through the display device 100. Further, in the case of the fully wound state in which the display part DP is accommodated within the housing part HP, the display device 100 is reduced in volume and facilitated to be transported.

A driving part for winding or unwinding the display part DP to switch the display part DP to the fully unwound state or the fully wound state may be disposed.

Although not illustrated, the driving part may include a roller unit that winds or unwinds the display part DP, and a lifting unit capable of moving the display part DP in the vertical direction according to a driving of the roller unit.

The roller unit rotates clockwise or counterclockwise, and may wind or unwind the display part DP that is fixed to the roller unit.

Figure 2:
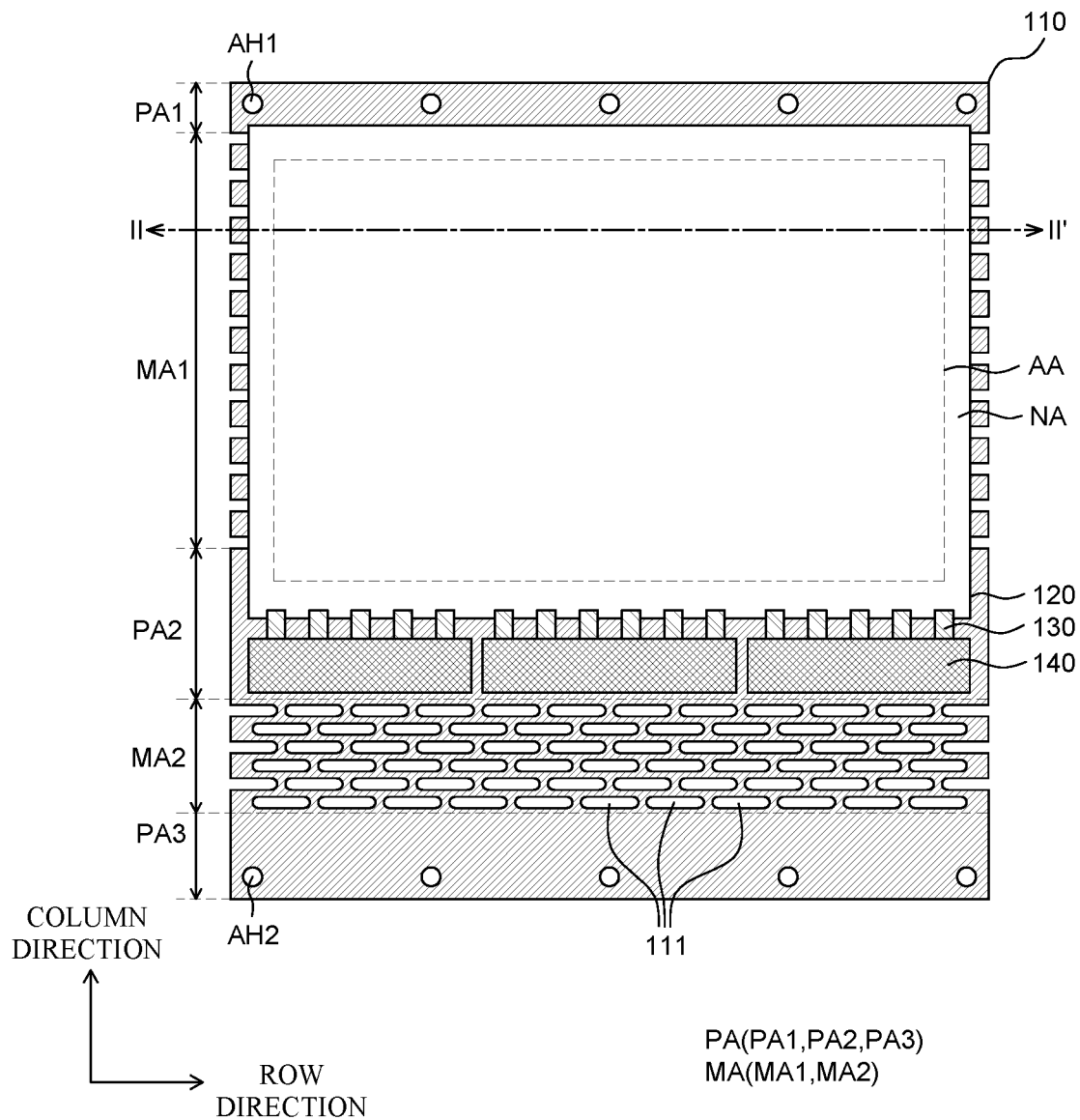
FIG. 2 is a plan view of the display device according to an exemplary aspect of the present disclosure.

FIG. 2 is a plan view of the display device according to an exemplary aspect of the present disclosure.

Figure 3:
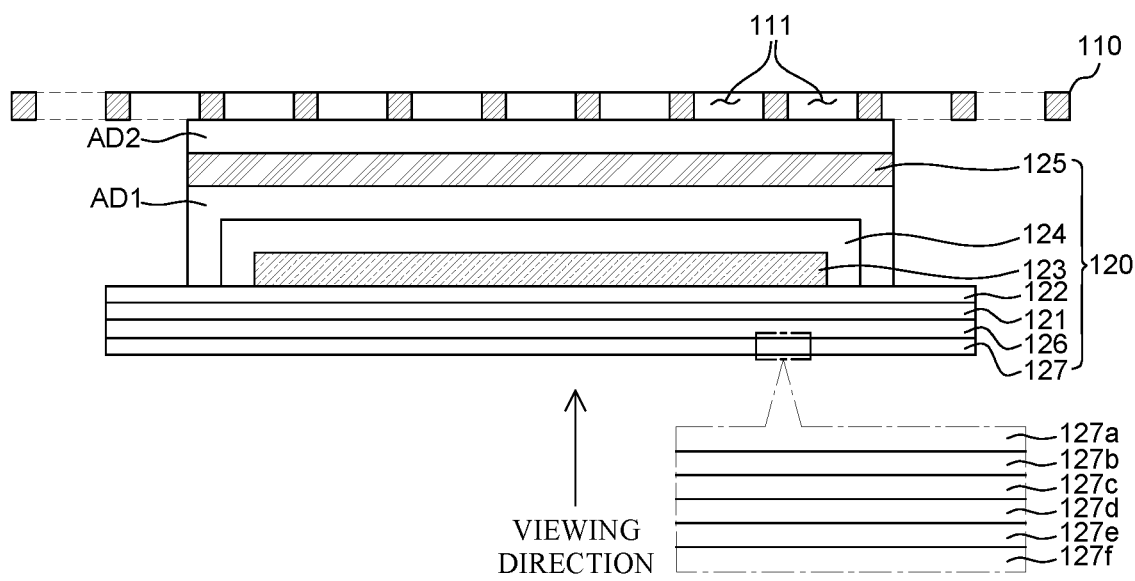
FIG. 3 is a cross-sectional view taken along of FIG. 2.

FIG. 3 is a cross-sectional view taken along II-II' of FIG. 2.

Figure 4:
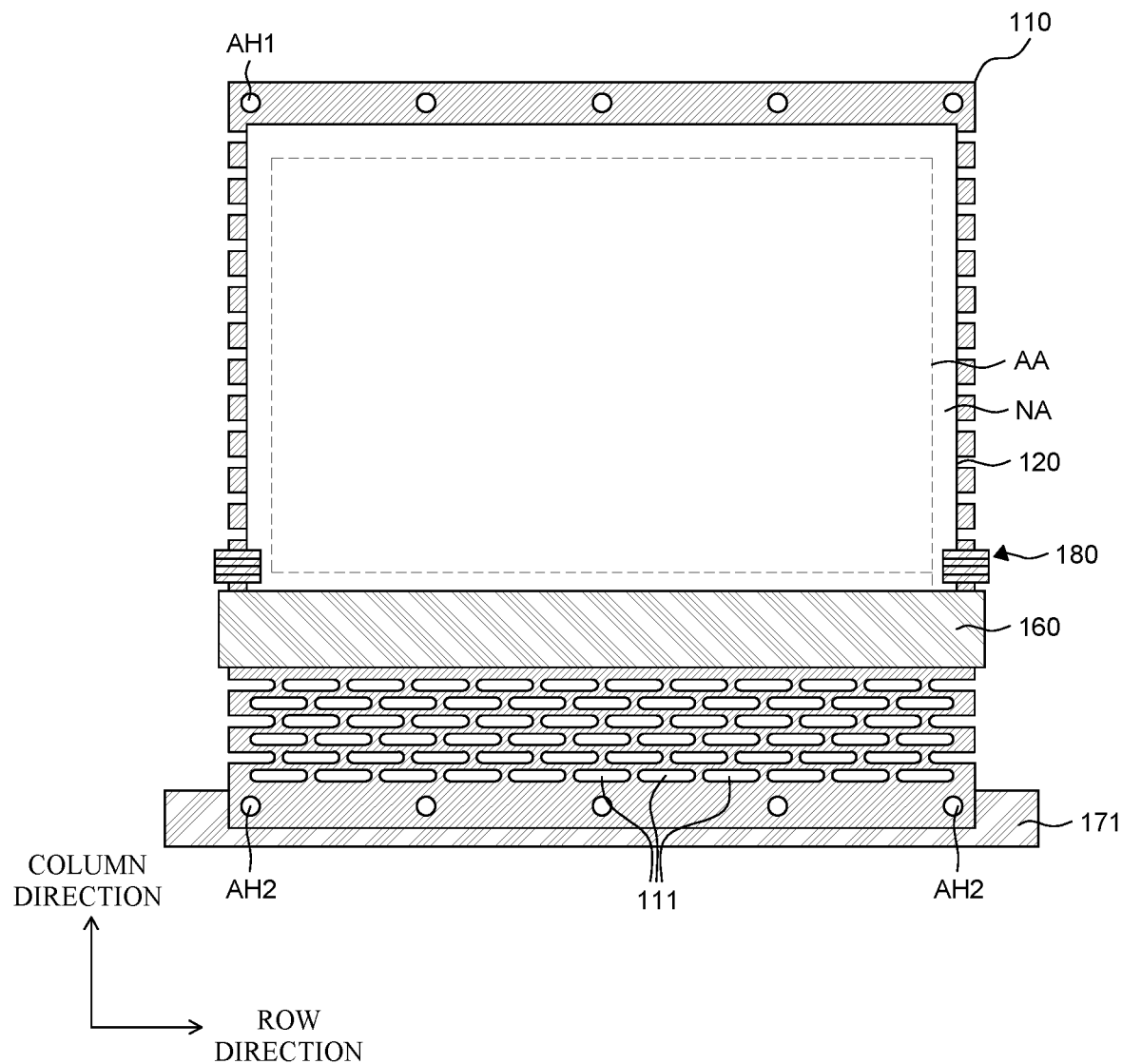
FIG. 4 is a plan view of the display device according to an exemplary aspect of the present disclosure.

FIG. 4 is a plan view of the display device according to an exemplary aspect of the present disclosure.

FIGS. 2 and 4 are plan views of the display device 100 when viewed from a front. Here, although FIGS. 2 and 4 illustrate a case in which a back cover 110 extends downwardly and forms an extension sheet integrally, the present disclosure is not limited thereto, and the back cover 110 and the extension sheet may be configured separately.

FIG. 2 is a plan view of the display part DP of the display device 100 before a cover unit 160, side covers 180, and a roller 171 are attached, and FIG. 4 is a plan view of the display device 100 after the cover unit 160, the side covers 180, and the roller 171 are attached.

Referring to FIGS. 2 to 4, the display part DP may include the back cover 110, a display panel 120, flexible films 130, and printed circuit boards 140.

The back cover 110 may include a plurality of support areas PA and a plurality of malleable areas MA. The plurality of support areas PA are areas in which a plurality of openings 111 are not disposed, and the plurality of malleable areas MA are areas in which the plurality of openings 111 are disposed. Specifically, a first support area PA1, a first malleable area MA1, a second support area PA2, a second malleable area MA2, and a third support area PA3 may be disposed sequentially from an uppermost portion of the back cover 110, but the present disclosure is not limited thereto.

The first support area PA1 of the back cover 110, an uppermost area of the back cover 110, is an area fastened to a head bar. First fastening holes AH1 may be formed in the first support area PA1 for fastening with the head bar. In addition, screws that pass through the head bar and the first fastening holes AH1 may be disposed so that the first support area PA1 of the back cover 110 and the head bar may be fastened. As the first support area PA1 is fastened to the head bar, when a link unit coupled to the head bar is raised or lowered, the back cover 110 may also be raised or lowered together therewith, and the display panel 120 attached to the back cover 110 may also be raised or lowered together with the back cover 110.

Although it is illustrated that the number of the first fastening holes AH1 is five in FIGS. 2 and 4, the number of the first fastening holes AH1 is not limited thereto.

In addition, although it has been described that the back cover 110 is fastened to the head bar using the first fastening holes AH1 in FIGS. 2 and 4, the present disclosure is not limited thereto, and the back cover 110 may be fastened to the head bar without a separate fastening hole.

The first malleable area MA1 is an area extending from the first support area PA1 to a lower side of the back cover 110. In addition, the first malleable area MA1 is an area in which the plurality of openings 111 are disposed and to which the display panel 120 is attached.

When the display part DP is wound around the roller 171 so that the display part DP is accommodated within the housing part, the first malleable area MA1 of the back cover 110 and the display panel 120 attached to the first malleable area MA1 may be wound around the roller 171. In this case, the first malleable area MA1 of the back cover 110 may have high flexibility because the plurality of openings 111 are formed therein, and may be easily wound around the roller 171, together with the display panel 120.

The first malleable area MA1 of the back cover 110 is an area that is wound or unwound around the roller 171, together with the display panel 120. The first malleable area MA1 may overlap at least the display panel 120 among other components of the display part DP.

The plurality of openings 111 may be disposed in the first malleable area MA1 of the back cover 110. Here, when the display part DP is wound or unwound, the plurality of openings 111 may be deformed by stress applied to the display part DP. Specifically, when the display part DP is wound or unwound, the first malleable area MA1 of the back cover 110 may be deformed as the plurality of openings 111 contract or expand. As the plurality of openings 111 contract or expand, a slip phenomenon of the display panel 120 that is disposed over the first malleable area MA1 of the back cover 110 is minimized, and stress applied to the display panel 120 may be minimized.

The second support area PA2 is an area extending from the first malleable area MA1 to the lower side of the back cover 110. The flexible films 130 and the printed circuit boards 140 that are connected to one end of the display panel 120 may be attached to the second support area PA2. Also, the cover unit 160 may be disposed in the second support area PA2 to cover a portion of a non-display area NA of the display panel 120, the flexible films 130, and the printed circuit boards 140.

In FIG. 2, for convenience of explanation, a case in which the flexible films 130 and the printed circuit boards 140 are disposed to be elongated downwardly of the display panel 120 is illustrated as an example. However, in the case of a rear folding method, the printed circuit boards 140 are positioned on a rear surface of the display panel 120 and the flexible films 130 may be folded toward the rear surface of the display panel 120 and attached to the printed circuit boards 140. However, the present disclosure is not limited to the rear folding method, and a top folding method in which the printed circuit boards 140 are disposed on an upper surface of the display panel 120 is also applicable.

In this case, the second support area PA2 may support the flexible films 130 and the printed circuit boards 140 to be wound in a planar shape rather than a curved shape on the roller 171 in order to protect the flexible films 130 and the printed circuit boards 140. Also, a portion of the roller 171 may be formed in a planar shape to correspond to the second support area PA2. However, the present disclosure is not limited thereto.

The back cover 110 extends downwardly so that a display area AA of the display panel 120 may be disposed outside the housing part, and may constitute the second malleable area MA2 and the third support area PA3.

In this case, the second malleable area MA2 is an area extending from the second support area PA2 to the lower side of the back cover 110. Also, the plurality of openings 111 may be disposed in the second malleable area MA2.

The second malleable area MA2 is an area extended so that the display area AA of the display panel 120 can be disposed outside the housing part. For example, when the back cover 110 and the display panel 120 are in the fully unwound state, areas from the third support area PA3 of the back cover 110 that is fixed to the roller 151 to the second support area PA2 to which the flexible films 130 and the printed circuit boards 140 are attached may be disposed inside the housing part, and the first support area PA1 and the first malleable area MA1 to which the display panel 120 is attached may be disposed outside the housing part.

The third support area PA3 of the back cover 110, a lowermost area of the back cover 110, is an area fastened to the roller 171. Second fastening holes AH2 may be formed in the third support area PA3 for fastening with the roller 171. For example, screws that pass through the roller 171 and the second fastening holes AH2 may be disposed so that the roller 171 and the third support area PA3 of the back cover 110 may be fastened. As the third support area PA3 is fastened to the roller 171, the back cover 110 may be wound or unwound by the roller 171 by rotation of the roller 171.

Although it is illustrated that the number of the second fastening holes AH2 is five in FIGS. 2 and 4, the number of the second fastening holes AH2 is not limited thereto.

Referring again to FIGS. 2 to 4, the display panel 120 may be disposed on an upper surface of the back cover 110. For example, on the upper surface of the back cover 110, the display panel 120 may be disposed in the first malleable area MA1.

The display panel 120 is a panel for displaying an image to a user.

In the display panel 120, display elements for displaying an image, a driving element for driving the display elements, lines for transmitting various signals to the display elements and the driving elements, and the like may be disposed.

The display element may be defined differently depending on a type of the display panel 120. For example, when the display panel 120 is an organic light emitting display panel, the display element may be an organic light emitting element including an anode, an organic light emitting layer, and a cathode. For example, when the display panel 120 is a liquid crystal display panel, the display element may be a liquid crystal display element. Hereinafter, it is described assuming that the display panel 120 is an organic light emitting display panel, but the display panel 120 is not limited to the organic light emitting display panel. Also, since the display device 100 according to an exemplary aspect of the present disclosure is a rollable display device, the display panel 120 may be implemented as a flexible display panel so as to be wound or unwound around the roller 171.

The display panel 120 may include the display area AA and the non-display area NA.

The display area AA is an area in which an image is displayed on the display panel 120.

A plurality of sub-pixels constituting a plurality of pixels and a driving circuit for driving the plurality of sub-pixels may be disposed in the display area AA.

The plurality of sub-pixels are minimum units constituting the display area AA, and the display element may be disposed in each of the plurality of sub-pixels. For example, an organic light emitting element including an anode, an organic light emitting layer, and a cathode may be disposed in each of the plurality of sub-pixels, but the present disclosure is not limited thereto. In addition, the driving circuit for driving the plurality of sub-pixels may include driving elements and lines. For example, the driving circuit may be formed of a thin film transistor, a storage capacitor, a gate line, a data line, and the like, but is not limited thereto.

The non-display area NA is an area in which an image is not displayed. Various lines and circuits for driving the organic light emitting element of the display area AA may be disposed in the non-display area NA. For example, link lines or driver ICs such as a gate driver IC and a data driver IC for transmitting signals to the plurality of sub-pixels and the driving circuit, a plurality of the flexible films 130, and the like may be disposed in the non-display area NA, but the present disclosure is not limited thereto. A pad portion may be positioned in the non-display area NA under the display panel 120.

As described above, the plurality of flexible films 130 may be disposed in the second support area PA2 of the back cover 110. The plurality of flexible films 130 are films for supplying signals to the plurality of sub-pixels and the driving circuit of the display area AA by disposing various components such as driver ICs on a flexible base film, and may be electrically connected to the display panel 120.

The display part DP according to the present disclosure may further include the cover unit 160.

The cover unit 160 may be disposed in the second support area PA2 of the back cover 110 and accommodate the printed circuit boards 140 therein. The printed circuit boards 140 and a portion of the second support area PA2 of the back cover 110 corresponding to the printed circuit boards 140 may be inserted into the cover unit 160. The cover unit 160 may be disposed to cover the printed circuit boards 140 and support and protect the printed circuit boards 140.

The cover unit 160 of the present disclosure may include a base plate and a cover plate, but the present disclosure is not limited thereto. A detailed description of the cover unit 160 will be described later with reference to FIG. 5.

Meanwhile, the cover unit 160 and the back cover 110 may be fastened to each other. For example, fixing holes are formed in the second support area PA2 of the back cover 110, and the cover unit 160 and the back cover 110 may be fastened to each other in such a manner that protrusions protruding from the base plate are inserted into the fixing holes. Alternatively, for example, the cover unit 160 and the back cover 110 may be fastened to each other by fastening members such as screws passing through the base plate, the cover plate, and the back cover 110. In this case, fastening members such as screws may be disposed so as not to interfere with the printed circuit boards 140 so that the printed circuit boards 140 are disposed inside the cover unit 160. However, the present disclosure is not limited thereto, and the cover unit 160 and the back cover 110 may be fastened in various manners.

The non-display area NA may be an area surrounding the display area AA as illustrated in FIG. 2. However, the present disclosure is not limited thereto, and the non-display area NA may be defined as an area extending from the display area AA.

Meanwhile, the back cover 110 is disposed on rear surfaces of the display panel 120, the flexible films 130, and the printed circuit boards 140, and may support the display panel 120, the flexible films 130 and the printed circuit boards 140. Accordingly, the back cover 110 may be larger than a size of the display panel 120. Accordingly, the back cover 110 may protect other components of the display part DP from the outside. Although the back cover 110 is formed of a material having rigidity, at least a portion of the back cover 110 may have predetermined flexibility so as to be wound or unwound together with the display panel 120. For example, the back cover 110 may be formed of a metallic material such as steel use stainless (SUS) or Invar, or a material such as plastic. However, a material of the back cover 110 may be variously changed as long as it satisfies physical property conditions such as a thermal deformation amount, a radius of curvature, and rigidity according to design, but the present disclosure is not limited thereto.

Referring to FIG. 3, the display panel 120 may include a substrate 121, a buffer layer 122, a pixel unit 123, an encapsulation layer 124, an encapsulation substrate 125, a barrier film 126, and a polarizing plate 127.

The substrate 121 is a base member for supporting various components of the display panel 120, and may be formed of an insulating material. The substrate 121 may be formed of a material having flexibility so that the display panel 120 is wound or unwound. For example, the substrate 121 may be formed of a plastic material such as polyimide (PI).

The buffer layer 122 may prevent diffusion of moisture and/or oxygen penetrating from the outside of the substrate 121. The buffer layer 122 may be formed of a single layer or multilayers of silicon oxide (SiOx) and silicon nitride (SiNx), but is not limited thereto.

The pixel unit 123 is disposed on upper surfaces of the substrate 121 and the buffer layer 122. The pixel unit 123 may include a plurality of organic light emitting elements and a circuit for driving the organic light emitting elements. The pixel unit 123 may be disposed to correspond to the display area AA.

The display panel 120 may be configured in a top emission method or a bottom emission method according to a direction in which light emitted from the organic light emitting element is emitted.

The top emission method is a method in which light emitted from the organic light emitting element is emitted upwardly of the substrate 121 on which the organic light emitting element is formed. In the case of the top emission method, a reflective layer may be formed under the anode so that the light emitted from the organic light emitting element travels upwardly of the substrate 121, that is, toward the cathode.

The bottom emission method is a method in which light emitted from the organic light emitting element is emitted downwardly of the substrate 121 on which the organic light emitting element is formed. In the case of the bottom emission method, the anode may be formed of a transparent conductive material and the cathode may be formed of a metallic material having high reflectance so that the light emitted from the organic light emitting element travels downwardly of the substrate 121.

Hereinafter, for convenience of explanation, it is described assuming that the display device 100 is a display device in the bottom emission method, but the present disclosure is not limited thereto.

The circuit for driving the organic light emitting element may be disposed in the pixel unit 123. The circuit may be formed of a thin film transistor, a storage capacitor, a gate line, a data line, a power line, and the like, but may be variously changed according to the design of the display device 100.

The encapsulation layer 124 that covers the pixel unit 123 may be disposed on the pixel unit 123. The encapsulation layer 124 encapsulates the organic light emitting element of the pixel unit 123. The encapsulation layer 124 may protect the organic light emitting element of the pixel unit 123 from external moisture, oxygen, impact, and the like. The encapsulation layer 124 may be formed by alternately stacking a plurality of inorganic layers and a plurality of organic layers.

The encapsulation substrate 125 may be disposed on the encapsulation layer 124. The encapsulation substrate 125 protects the organic light emitting element of the pixel unit 123, together with the encapsulation layer 124. The encapsulation substrate 125 may protect the organic light emitting element of the pixel unit 123 from external moisture, oxygen, impact, and the like.

A first adhesive layer AD1 may be disposed between the encapsulation layer 124 and the encapsulation substrate 125. The first adhesive layer AD1 may bond the encapsulation layer 124 and the encapsulation substrate 125. The first adhesive layer AD1 may be formed of a material having an adhesive property, and may be a thermosetting type or natural curing type adhesive.

Meanwhile, the first adhesive layer AD1 may be disposed to surround the encapsulation layer 124 and the pixel unit 123. That is, the pixel unit 123 may be encapsulated by the buffer layer 122 and the encapsulation layer 124, and the encapsulation layer 124 and the pixel unit 123 may be encapsulated by the buffer layer 122 and the first adhesive layer AD1. The first adhesive layer AD1 together with the encapsulation layer 124 and the encapsulation substrate 125 may protect the organic light emitting element of the pixel unit 123 from external moisture, oxygen, impact, and the like. The first adhesive layer AD1 may further include a moisture absorbent. The moisture absorbent may be particles having hygroscopicity, and may absorb moisture and oxygen from the outside, thereby minimizing penetration of moisture and oxygen into the pixel unit 123.

The barrier film 126 may be disposed on an upper surface of the substrate 121. The barrier film 126 may protect the display panel 120 from external impact, moisture, heat, and the like. The barrier film 126 may be formed of a polymer resin having lightweight and unbreakable properties.

A polarizing plate 127 may be disposed on an upper surface of the barrier film 126.

The polarizing plate 127 is a component to prevent external light incident on the display device 100 from being reflected and visually recognized. For example, the polarizing plate 127 may include a surface layer 127f, a first protective layer 127e, a polarization layer 127d, a second protective layer 127c, a phase retardation layer 127b, and an adhesive layer 127a. However, the polarizing plate 124 may be omitted according to aspects of the display device 100.

The back cover 110 may be disposed on the encapsulation substrate 125. The back cover 110 may be disposed to contact the encapsulation substrate 125 of the display panel 120 and protect the display panel 120.

A second adhesive layer AD2 may be disposed between the encapsulation substrate 125 and the back cover 110. The second adhesive layer AD2 may bond the encapsulation substrate 125 and the back cover 110. The second adhesive layer AD2 may be formed of a material having an adhesive property, and may be a thermosetting type or natural curing type adhesive.

Meanwhile, the display device 100 according to an exemplary aspect of the present disclosure is characterized in that stress generated during rolling can be reduced by supporting the display panel 121 through fastening the side covers 180 to both side surfaces of the display part DP in contact with a low-curvature contact portion of the roller 171. This will be described in detail with reference to FIG. 5 to FIGS. 8a and 8b.

Figure 5:
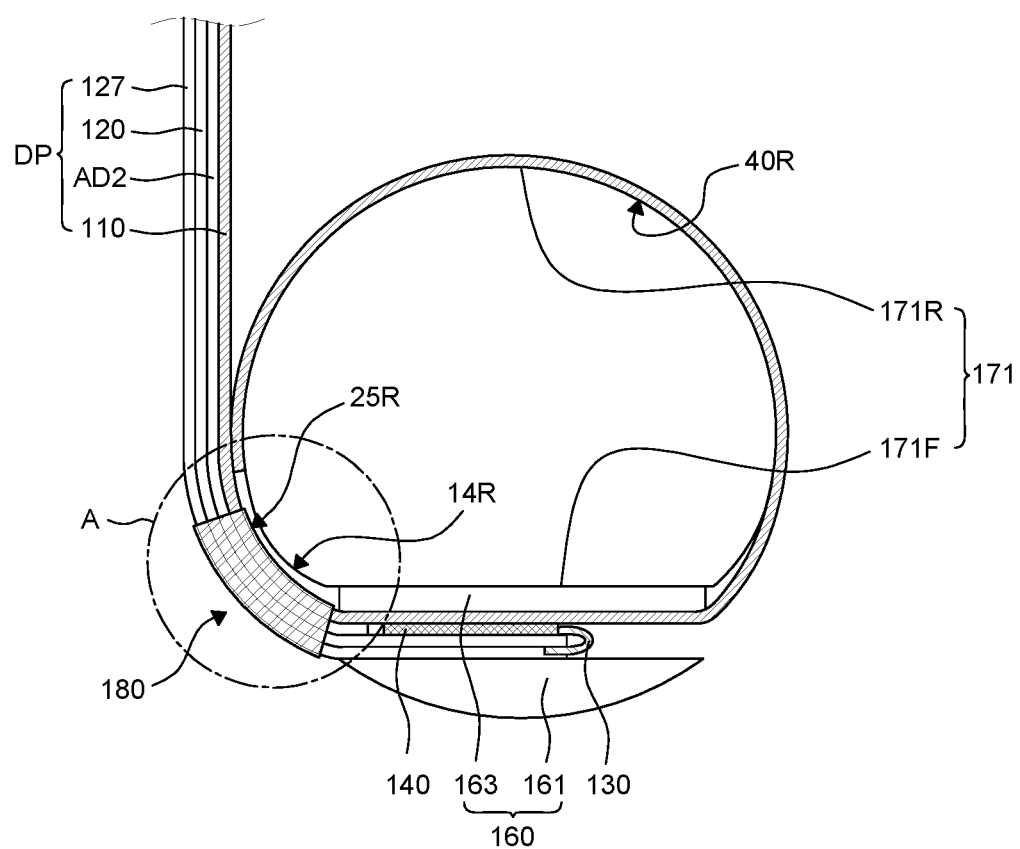
FIG. 5 is a partial cross-sectional view of the display device according to an exemplary aspect of the present disclosure.

FIG. 5 is a partial cross-sectional view of the display device according to an exemplary aspect of the present disclosure.

Figure 6:
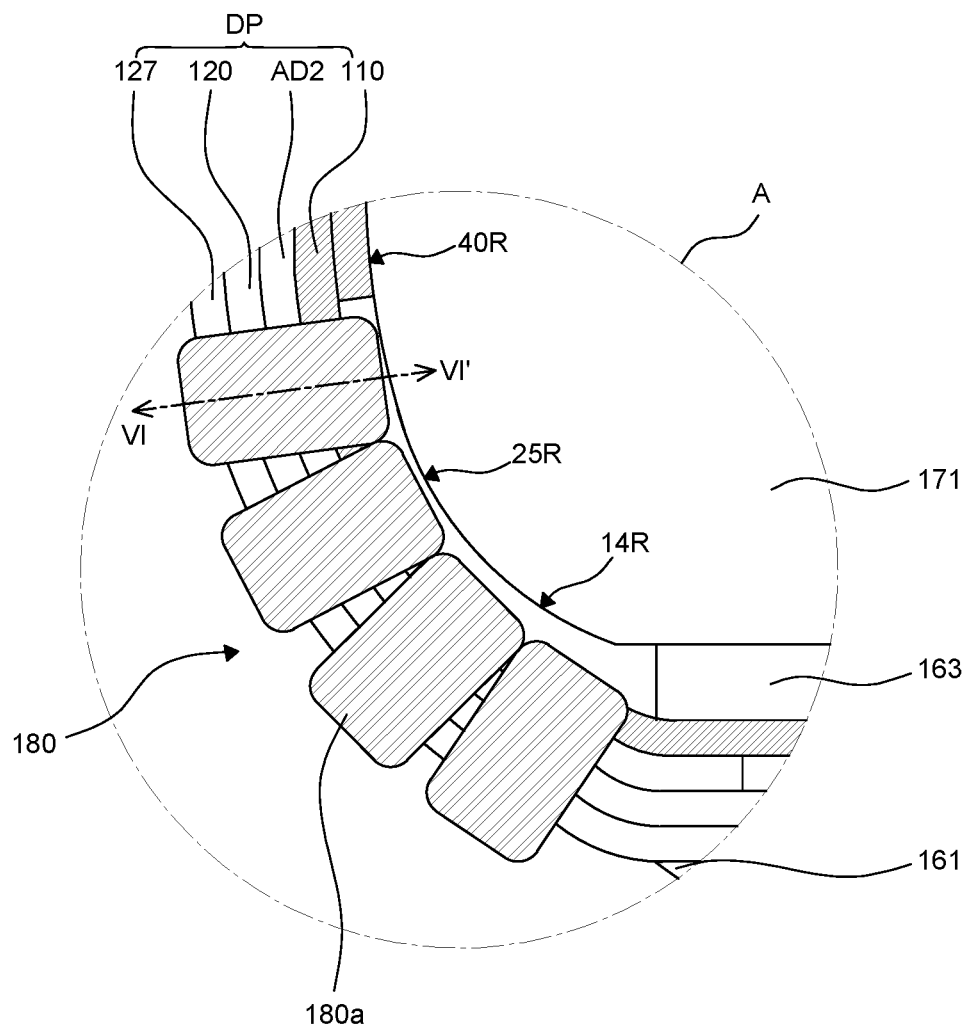
FIG. 6 is an enlarged view of portion A of FIG. 5.

FIG. 6 is an enlarged view of portion A of FIG. 5.

Figure 7:
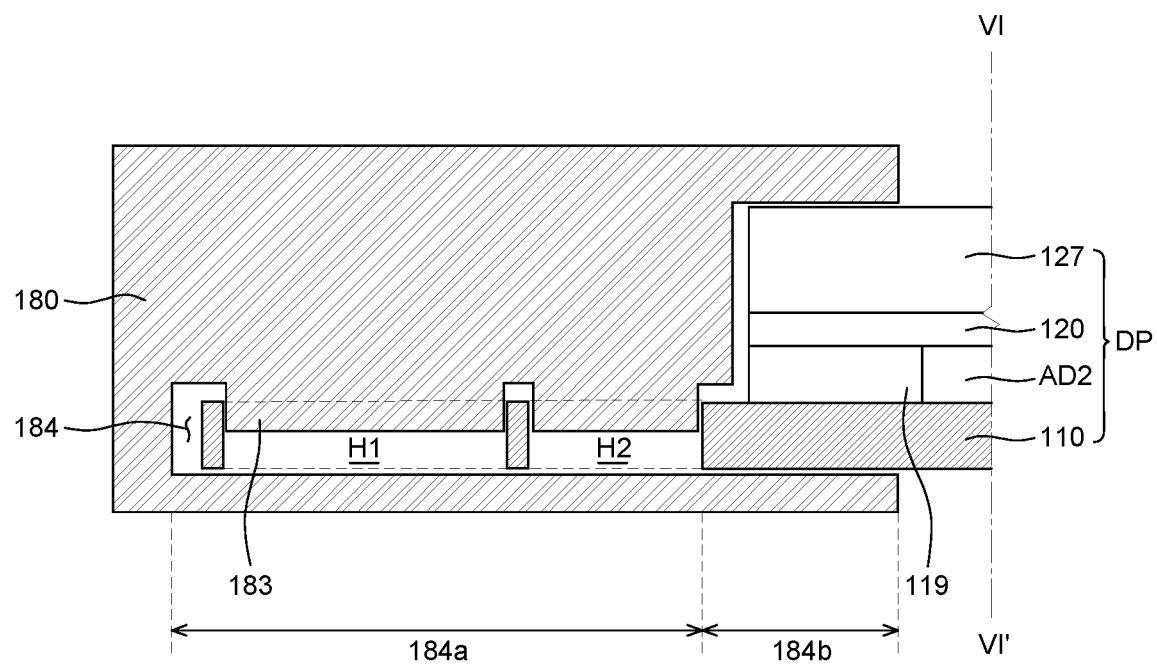
FIG. 7 is a cross-sectional view taken along VI-VI' of FIG. 6.

FIG. 7 is a cross-sectional view taken along VI-VI' of FIG. 6.

Figure 8A:
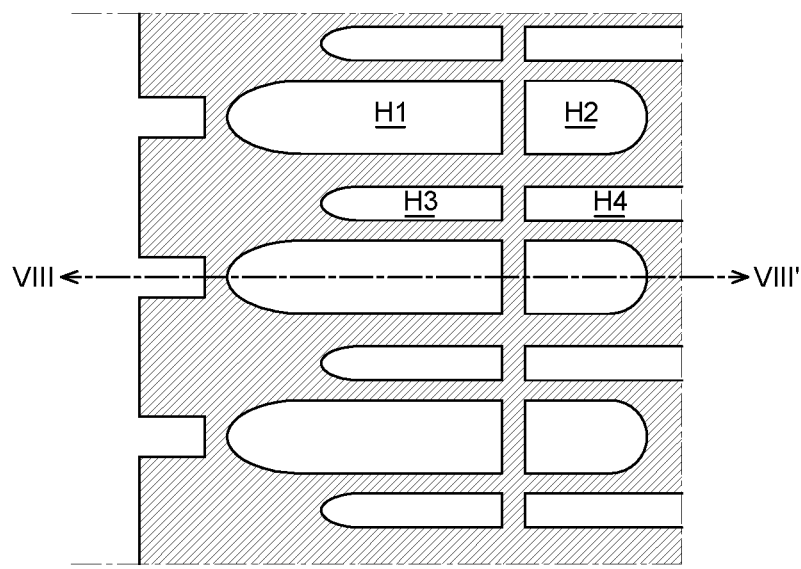
FIG. 8A is a partial plan view of a back cover according to an exemplary aspect of the present disclosure.

FIG. 8a is a partial plan view of a back cover according to an exemplary aspect of the present disclosure.

Figure 8B:
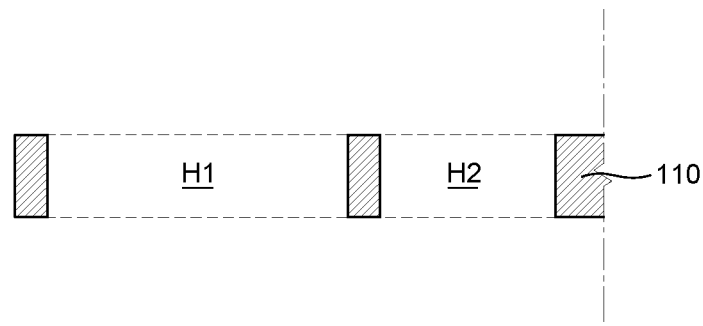
FIG. 8B is a cross-sectional view taken along line XIII-XIII' of FIG. 8A.

FIG. 8b is a cross-sectional view taken along line XIII-XIII' of FIG. 8a.

FIG. 5 illustrates a portion of a cross-section of the display part DP fastened to the roller 171, and FIG. 6 shows an enlarged view of a portion of the display part DP to which the side cover 180 is fastened.

FIG. 7 illustrates an example of a cross-sectional structure of the display part DP to which the side cover 180 is fastened when the display part DP of FIG. 6 is viewed from above.

Referring to FIG. 5 to FIGS. 8A and 8B, the display part DP may include the back cover 110, the display panel 120, the flexible film 130, and the printed circuit board 140.

In addition, the second adhesive layer AD2 may be disposed between the display panel 120 and the back cover 110. The second adhesive layer AD2 may bond the display panel 120 and the back cover 110.

The polarizing plate 127 may be disposed on the upper surface of the display panel 120. The polarizing plate 127 is a component to prevent external light incident on the display device 100 from being reflected and visually recognized.

A sealing layer 119 may be disposed on the buffer layer in the non-display area of the display panel 120.

The sealing layer 119 may be disposed to surround the display area in the non-display area, and may be disposed to surround the encapsulation layer, the encapsulation substrate, and the second adhesive layer AD2, but the present disclosure is not limited thereto.

As described above, the sealing layer 119 may be formed to prevent moisture permeation through side portions of the display device 100 and to minimize defects in a subsequent process.

The sealing layer 119 may be formed of a micro-seal, but is not limited thereto.

FIG. 5 illustrates a rear folding method as an example. In the rear folding method, the printed circuit board 140 is positioned on the rear surface of the display panel 120, and the flexible film 130 is folded toward the rear surface of the display panel 120 and may be attached to the printed circuit board 140. However, the present disclosure is not limited thereto.

In this case, the second support area of the back cover 110 may support the flexible film 130 and the printed circuit board 140 to be wound in a flat shape rather than a curved surface, on the roller 171. In addition, the roller 171 may also have a flat portion 171F corresponding to the second support area of the back cover 110, but is not limited thereto.

The cover unit 160 may be disposed in the second support area of the back cover 110 to cover a portion of the non-display area of the display panel 120, the flexible film 130, and the printed circuit board 140.

As described above, the cover unit 160 may be disposed in the second support area of the back cover 110 and accommodate the printed circuit board 140 therein. The printed circuit board 140 and a portion of the second support area of the back cover 110 corresponding to the printed circuit board 140 may be inserted into the cover unit 160. The cover unit 160 may be disposed to cover the printed circuit board 140 and support and protect the printed circuit board 140.

The cover unit 160 of the present disclosure may include a base plate 161 and a cover plate 163, but is not limited thereto.

The base plate 161 may be disposed on a surface opposite to the upper surface of the back cover 110, that is, the rear surface thereof. The base plate 161 may be fixed to the second support area, on the rear surface of the back cover 110 on which the display panel 120 is not disposed. That is, the base plate 161 and the printed circuit board 140 may be disposed to correspond to each other with the back cover 110 interposed therebetween. Accordingly, the base plate 161 may support the printed circuit board 140, together with the second support area. For example, the base plate 161 may be formed of a material having a rigidity and may support the second support area flat, but is not limited thereto.

The cover plate 163 may be disposed on an upper surface of the display part DP.

The cover plate 163 is disposed to cover the display part DP and the printed circuit board 140 disposed on the second support area of the back cover 110, and may have an upper surface which is convex. That is, the upper surface of the cover plate 163 may be formed of a curved surface.

The cover plate 163 may be fixed to the back cover 110 and the base plate 161, on the upper surface of the display part DP on which the display panel 120 and the printed circuit board 140 are disposed. The cover plate 163 may be formed of a material having rigidity to protect the printed circuit board 140, but is not limited thereto.

When the display part DP is wound, the cover plate 163 of the cover unit 160 having rigidity is not deformed and maintains an original convex shape thereof and protects the plurality of flexible films 130 and the printed circuit boards 140. The convex-shaped cover plate 163 may form an approximate circular shape together with a curved portion 171R of the roller 171. For example, the base plate 161 having a flat shape and the cover plate 163 having a convex shape may form an approximate D shape. The cover unit 160 having the approximate D shape may be seated on the flat portion 171F of the roller 171 and form an approximately circular shape together with the curved portion 171R of the roller 171. Accordingly, the cover unit 160 and the roller 171 may form a single substantially circular shape, and a portion of the display panel 120 wound on the cover unit 160 may be wound with a larger radius of curvature, so that stress applied to the display panel 120 may be reduced.

Meanwhile, as described above, the display device 100 according to an exemplary aspect of the present disclosure is characterized by supporting the display panel 120 by fastening the side covers 180 to both side surfaces of the display part DP in contact with the low-curvature contact portion of the roller 171.

In the rollable display device 100 using polyimide as a substrate, a driving failure due to cracks in a gate in panel (GIP) unit, occurring at a side surface of the display panel 120 in a low-curvature area of the roller 171 having radii of curvature of 14R and 25R during repeated rolling, has become an issue.

For fixation of the printed circuit board 140, when a two-stage D-cut roller structure having radii of curvature of 14R and 25R is applied to a partial surface of the roller 171 having a radius of curvature of 40R, the display panel 120 may be excessively folded in the low-curvature area of the roller 171 having radii of curvature of 14R and 25R, and stress may occur during rolling. In addition, as fatigue accumulates through a repeated operation of rolling, it may cause cracks and damage to the GIP unit.

That is, as compared to the display panel 120 that is folded at the radius of curvature of 40R, the display panel 120 that is folded at the radii of curvature of 25R and 15R may be excessively folded. In this case, cracks and damage may occur in the GIP unit without the second adhesive layer AD2 and the encapsulation substrate.

Accordingly, the display device 100 according to an exemplary aspect of the present disclosure is characterized in that the display panel 120 is supported by fastening the side covers 180 to the both side surfaces of the display part DP in contact with the low-curvature contact portion of the roller 171, thereby reducing stress which occurs during rolling. Accordingly, it is possible to prevent cracks and damage to the GIP unit, thereby solving driving failure and reliability defects of the display panel 120.

The side cover 180 of the present disclosure may be composed of a plurality of unit side covers 180a. FIG. 6 illustrates that the number of the unit side covers 180a is four, but the present disclosure is not limited to the number of unit side covers 180a.

The side cover 180 of the present disclosure may be disposed to cover a portion of the non-display area of the display panel 120, for example, up to a bezel area.

The unit side cover 180a may have an approximately rectangular parallelepiped shape.

The unit side cover 180a may include an accommodation space 184 in which one side of the display part DP is fitted and accommodated.

The accommodation space 184 may have a step shape according to a side shape of the display part DP. That is, the accommodation space 184 may be divided into a first accommodation space 184a in which a side surface of the back cover 110 that protrudes than the side surface of the display part DP is accommodated, and a second accommodation space 184b in which the side surface of the display part DP other than the protruding side surface of the back cover 110 accommodated in the first accommodation space 184a is accommodated. The first accommodation space 184a and the second accommodation space 184b have different heights, and accordingly, a step may be formed from the second accommodation space 184b to the first accommodation space 184a.

Meanwhile, a predetermined thin film coating (not illustrated) may be formed on surfaces of the first accommodation space 184a and the second accommodation space 184b to prevent abrasion due to contact when the display part DP is fastened.

The unit side cover 180a may include one or more protrusions 183 protruding to the first accommodation space 184a.

The protrusions 183 may have shapes corresponding to a plurality of holes H1, H2, H3, and H4 in the side surface of the back cover 110. That is, an opening pattern that is formed of the plurality of holes H1, H2, H3, and H4 may be provided in the side surface of the back cover 110. Shapes of the plurality of holes H1, H2, H3, and H4 illustrated in in FIG. 8a are exemplary, and the present disclosure is not limited thereto. For example, the plurality of holes H1, H2, H3, and H4 may include first and third holes H1 and H3 that are located relatively externally, and second and fourth holes H2 and H4 that are located relatively internally, but the present disclosure is not limited thereto. Here, the term 'externally' refers to an edge side of the back cover 110, and the term 'internally' refers to a central side of the back cover 110.

For example, the first hole H1 may have a curved surface such as an ellipse or the like on an outside thereof and a straight line on an inside thereof, and the second hole H2 may have a straight line on an outside thereof and a curved surface such as an ellipse on an inside thereof, but the present disclosure is not limited thereto.

Between the first holes H1 and the second holes H2 in a vertical direction, the third holes H3 and the fourth holes H4 that are smaller in width than the first holes H1 and the second holes H2, are formed respectively, but the present disclosure is not limited thereto. For example, the third hole H3 may have a curved surface such as an ellipse on an outside thereof and a straight line on an inside thereof, and the fourth hole H4 may have a straight line on an outside and an inside thereof, but the present disclosure is not limited thereto.

The protrusions 183 may be fitted into the plurality of holes H1, H2, H3, and H4 in the side surface of the back cover 110.

The unit side cover 180a may include at least one fastening hole for fastening with the unit side cover 180a adjacent to an upper or lower end thereof.

Figure 9:
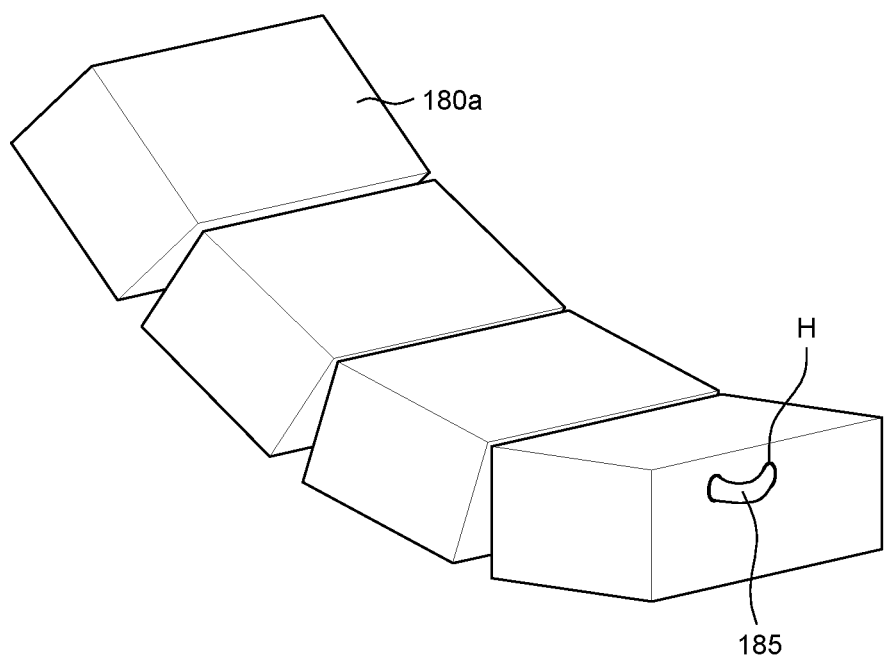
FIG. 9 is a perspective view of a side cover according to an exemplary aspect of the present disclosure.

FIG. 9 is a perspective view of a side cover according to an exemplary aspect of the present disclosure.

Figure 10A:
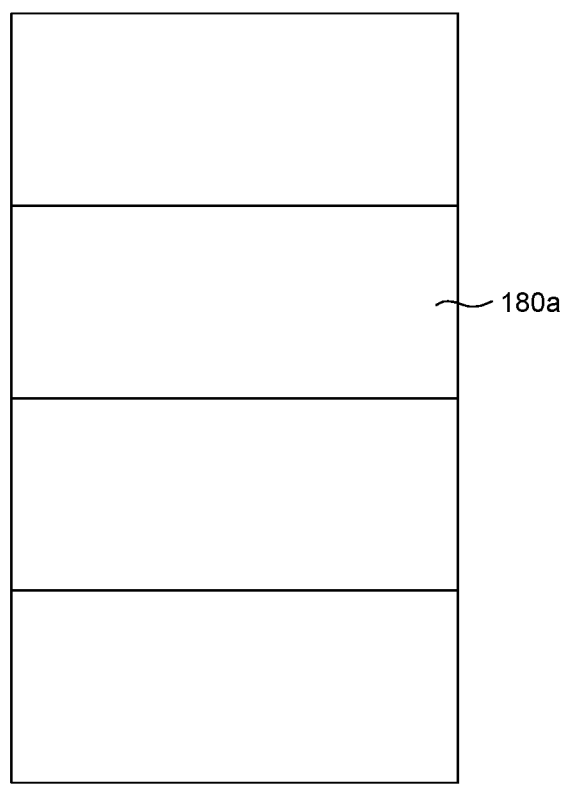
FIG. 10A and FIG. 10B are a plan view and a side view of the side cover of FIG. 9.
Figure 10B:
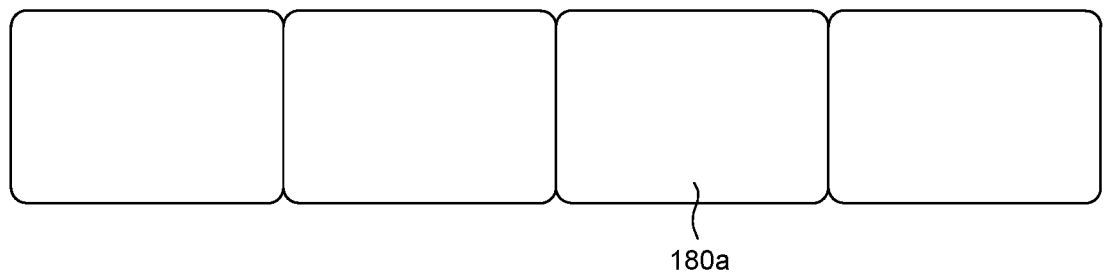

FIG. 10A and FIG. 10B are a plan view and a side view of the side cover of FIG. 9.

Figure 11A:
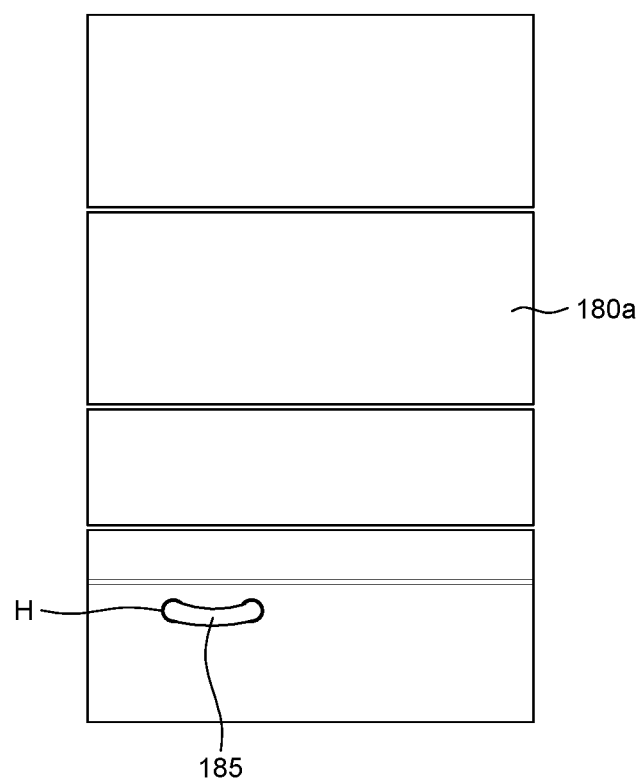
FIG. 11A and FIG. 11B are a plan view and a side view of the side cover of FIG. 9.
Figure 11B:
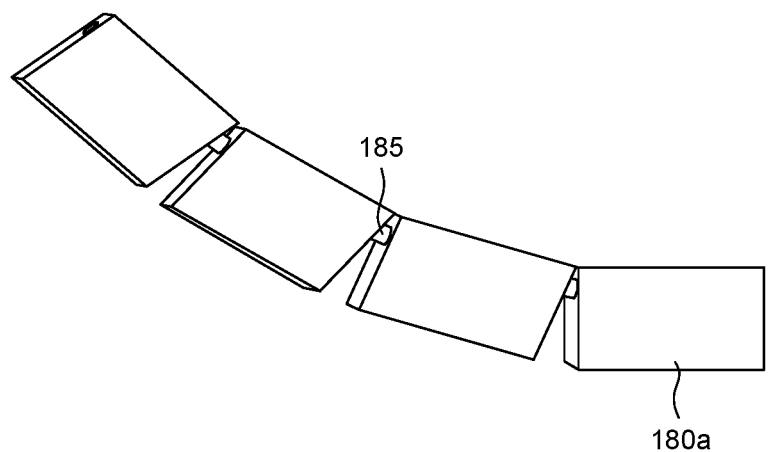

FIG. 11A and FIG. 11B are a plan view and a side view of the side cover of FIG. 9.

Figure 12:
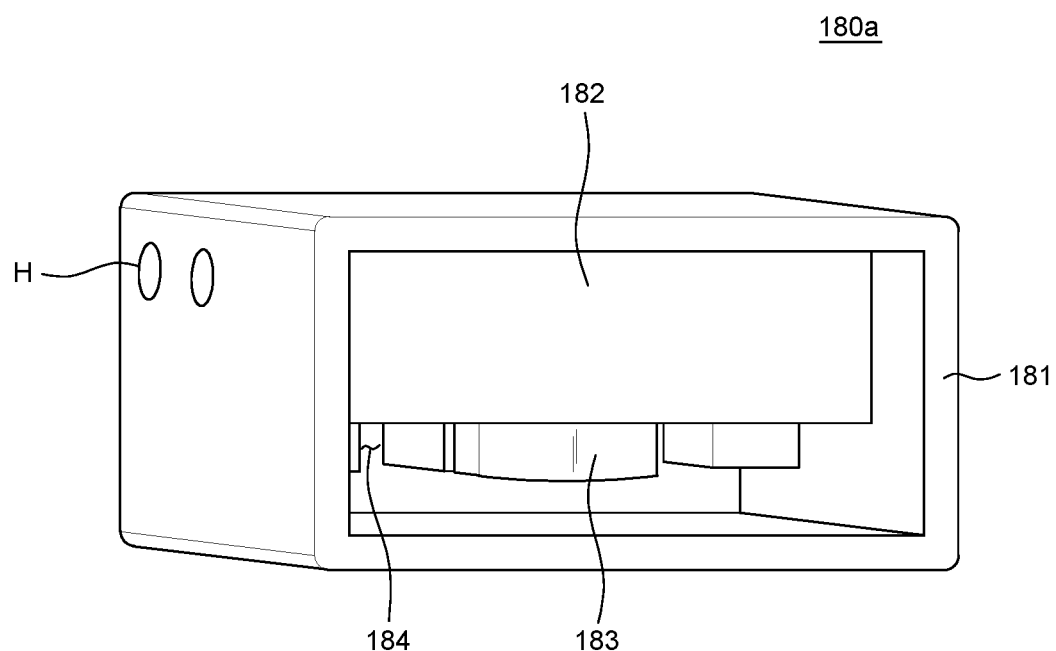
FIG. 12 is a perspective view of a unit side cover according to an exemplary aspect of the present disclosure.

FIG. 12 is a perspective view of a unit side cover according to an exemplary aspect of the present disclosure.

Figure 13A:
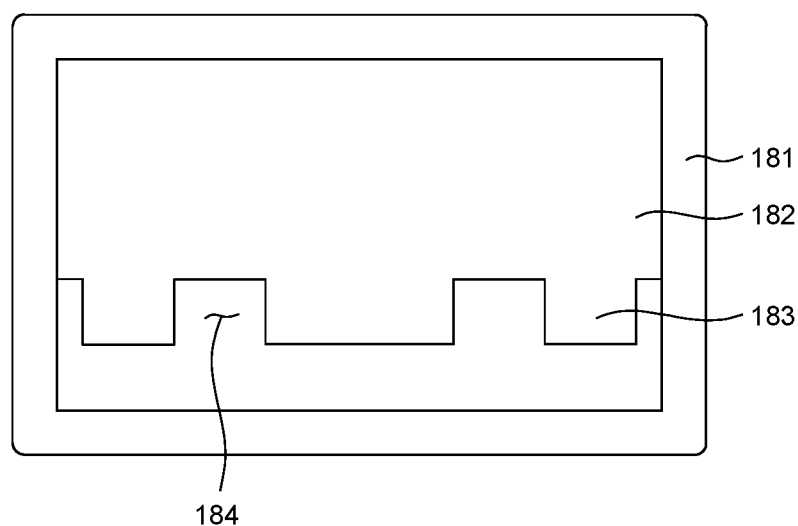
FIG. 13A and FIG. 13B are a side view and a rear view of the unit side cover of FIG. 12.
Figure 13B:
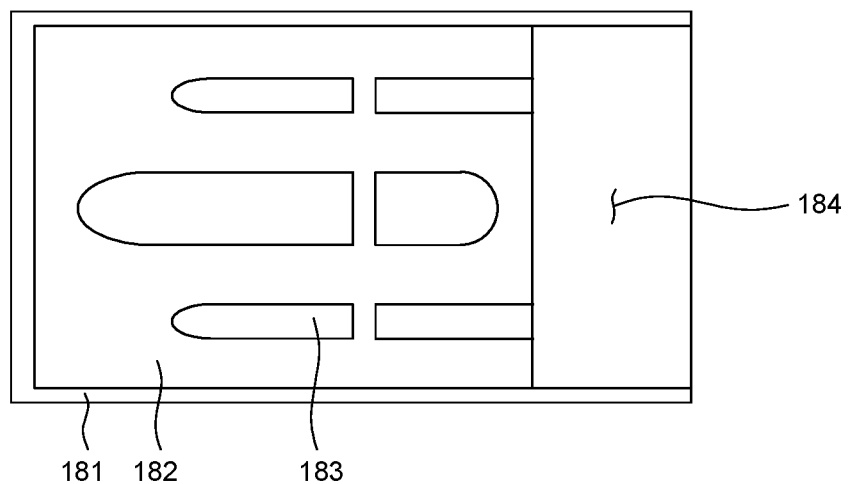

FIG. 13A and FIG. 13B are a side view and a rear view of the unit side cover of FIG. 12.

FIGS. 10A and 10B are a plan view and a side view of the side cover 180 before rolling, that is, before the display part is wound around the roller, and FIGS. 11A and 11B are a plan view and a side view of the side cover 180 during rolling.

FIG. 12 is a perspective view of the unit side cover 180a as viewed from a back cover side. In this case, an upper surface and a lower surface of the unit side cover 180a illustrated in FIG. 12 actually mean a front surface and a rear surface. Here, the front surface and the rear surface mean a front surface and a rear surface in a direction facing a screen of the display panel.

Referring to FIG. 9 to FIGS. 11A and 11B, the side cover 180 according to an exemplary aspect of the present disclosure may be composed of the plurality of unit side covers 180a.

The unit side cover 180a may include at least one fastening hole H for fastening with the unit side cover 180a adjacent to the upper or lower end thereof. That is, the fastening hole H is a perforated portion for connection between the unit side covers 180a, and the unit side covers 180a may be connected to each other using a wire 185 or the like to improve convenience of assembling and management.

The side cover 180 of the present disclosure may be disposed to cover a portion of the non-display area of the display panel, for example, up to the bezel area. Accordingly, referring to FIGS. 11A and 11B, the side cover 180 of the present disclosure is bent according to a rolling degree during rolling and supports the both sides of the display panel contacting the low-curvature contact portion of the roller, that is, the GIP unit, wholly, so that it is possible to prevent forming of a folded structure during existing rolling and reduce stress, thereby preventing occurrence of GIP cracks. For example, in the case of a 77-inch display device, when the bezel area is about 10 mm, the side cover 180 may be disposed to cover up to about 5 mm of the bezel area.

The side cover 180 has a structure that is fastened to the side surface of the display part, and each of the unit side covers 180a may support the front surface and the rear surface of the display part in a shape of '⊏'.

The unit side cover 180a may include one or more protrusions 183 protruding to the accommodation space 184 at the rear thereof.

That is, the unit side cover 180a according to an exemplary aspect of the present disclosure may be configured to include a body 81 having a shape of '⊏' in cross-section, a support portion 182 for supporting the display part, and the protrusions 183 fastened to the back cover. The body 181 and the support portion 182 may cover a portion of the bezel area of the display panel and prevent forming of a folded structure of the GIP unit. The protrusions 183 protrude for fastening with the plurality of holes in the side surface of the back cover, and may strengthen the fixing of the unit side cover 180a through fitting thereof with the plurality of holes.

The support portion 182 may be provided within the body 181 except for the accommodation space 184, and the protrusions 183 may protrude from the support portion 182 toward the accommodation space 184.

The protrusions 183 may have shapes corresponding to the plurality of holes in the side surface of the back cover. The protrusions 183 may be fitted into the plurality of holes in the side surface of the back cover. Accordingly, it is possible to prevent detachment of the unit side cover 180a in the repeated operation of rolling.

For example, the unit side cover 180a may have a height of about 3 mm and a width of about 5 mm based on the side view of FIG. 13A, but is not limited thereto.

For example, the unit side cover 180a may have a length of 20 mm to 25 mm based on the rear view of FIG. 13B, but is not limited thereto.

The exemplary aspects of the present disclosure can also be described as follows:

According to an aspect of the present disclosure, there is provided a display device. The display device includes a display panel including a non-display area, a back cover supporting the display panel on one surface of the display panel, a roller for winding or unwinding the display panel and the back cover and side covers covering a portion of the non-display area of the display panel and a portion of a side surface of the back cover corresponding thereto, and including a plurality of unit side covers to thereby support the non-display area of the display panel when the roller is wound.

The display device may further include a printed circuit board disposed on one surface of the display panel and a flexible film having one end connected to a pad portion of the non-display area of the display panel and the other end connected to the printed circuit board.

The display device may further include a cover unit disposed in a support area of the back cover and accommodating the printed circuit board.

The roller may include a flat portion corresponding to the support area of the back cover and a curved portion having at least one radius of curvature.

The cover unit may include a base plate disposed on a rear surface of the back cover and a cover plate disposed on an upper surface of the display panel.

An upper surface of the cover plate may be formed of a curved surface, and the base plate and the printed circuit board may be disposed to correspond to each other with the back cover interposed therebetween.

The unit side cover may have a rectangular parallelepiped shape and includes a body having a shape of '⊏' in cross-section and an accommodation space provided inside and having side surfaces of the display panel and the back cover fitted and accommodated therein.

The unit side cover may include a support portion for supporting the display panel inside the body and a protrusion coupled to the back cover.

The support portion mat be provided within the body except for the accommodation space.

The protrusion may protrude from the support portion.

The accommodation space may include a first accommodation space in which the side surface of the back may cover that protrudes than the side surface of the display panel is accommodated and a second accommodation space in which a remining side surface other than the protruding side surface of the back cover accommodated in the first accommodation space and the side surface of the display panel may be accommodated.

The first accommodation space and the second accommodation space may have different heights, and a step may be formed from the second accommodation space to the first accommodation space.

The unit side cover may include one or more protrusions protruding to the first accommodation space.

The side surface of the back cover may be provided with an opening pattern formed of a plurality of holes, and the protrusions may have shapes corresponding to the plurality of holes in the side surface of the back cover.

The unit side cover may be provided with at least one fastening hole for fastening with the unit side cover adjacent to an upper or lower end thereof, wherein the fastening hole may connect the unit side covers through a wire.

The display device may further include a polarizing plate disposed on the other surface of the display panel, an adhesive layer disposed between the display panel and the back cover and a sealing layer disposed on a side surface of the adhesive layer between the display panel and the back cover.

Side surfaces of the polarizing plate, the display panel, the sealing layer, and the back cover may be partially inserted into the second accommodation space.

A portion of an upper surface of the polarizing plate may be in contact with the body, and the polarizing plate, the display panel, the side surface of the sealing layer, and a portion of an upper surface of the back cover may be in contact with the support portion.

The printed circuit board may be disposed on a rear surface of the display panel, wherein the one end of the flexible film may be connected to the pad portion of the display panel, and the other end of the flexible film may be folded toward the rear surface of the display panel and may be connected to the printed circuit board.

The display device may further include a thin film coating provided on a surface of the accommodation space to prevent abrasion due to contact when the display panel and the back cover are fastened.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel having a non-display area;
    a back cover supporting the display panel on one surface of the display panel;
    a roller configured to wind or unwind the display panel and the back cover; and
    side covers covering a portion of the non-display area of the display panel and a portion of a side surface of the back cover corresponding thereto,
    wherein the side covers include a plurality of unit side covers and support the non-display area of the display panel when the roller is wound,
    wherein the roller includes a curved portion having a first curvature and a second curvature lower than the first curvature,
    wherein the side covers are disposed to correspond to the second curvature; and
    wherein the unit side cover has a rectangular parallelepiped shape and comprises: a body having a shape of "τ" in a cross-section; and an accommodation space provided inside and having side surfaces of the display panel and the back cover fitted and accommodated therein.

2. The display device of claim 1, further comprising:
    a printed circuit board disposed on one surface of the display panel; and
    a flexible film having one end connected to a pad portion of the non-display area of the display panel and another end connected to the printed circuit board.

3. The display device of claim 2, further comprising a cover unit disposed in a support area of the back cover and accommodating the printed circuit board.

4. The display device of claim 3, wherein the roller further includes,
a flat portion corresponding to the support area of the back cover.

5. The display device of claim 3, wherein the cover unit comprises:
a base plate disposed on a rear surface of the back cover; and
a cover plate disposed on an upper surface of the display panel.

6. The display device of claim 5, wherein an upper surface of the cover plate has a curved surface, and
wherein the base plate and the printed circuit board are disposed to correspond to each other with the back cover interposed therebetween.

7. The display device of claim 2, wherein the printed circuit board is disposed on a rear surface of the display panel, and
wherein the one end of the flexible film is connected to the pad portion of the display panel, and the another end of the flexible film is folded toward the rear surface of the display panel and is connected to the printed circuit board.

8. The display device of claim 1, wherein the unit side cover comprises: a support portion for supporting the display panel inside the body; and a protrusion coupled to the back cover.

9. The display device of claim 8, wherein the support portion is provided within the body except for the accommodation space.

10. The display device of claim 8, wherein the protrusion protrudes from the support portion.

11. The display device of claim 1, wherein the accommodation space comprises: a first accommodation space in which the side surface of the back cover that protrudes from the side surface of the display panel is accommodated; and a second accommodation space in which a remining side surface other than the protruding side surface of the back cover accommodated in the first accommodation space and the side surface of the display panel are accommodated.

12. The display device of claim 11, wherein the first accommodation space and the second accommodation space have different heights, and a step is formed from the second accommodation space to the first accommodation space.

13. The display device of claim 12, further comprising:
a polarizing plate disposed on another surface of the display panel;
an adhesive layer disposed between the display panel and the back cover; and
a sealing layer disposed on a side surface of the adhesive layer between the display panel and the back cover.

14. The display device of claim 13, wherein side surfaces of the polarizing plate, the display panel, the sealing layer, and the back cover are partially inserted into the second accommodation space.

15. The display device of claim 13, wherein a portion of an upper surface of the polarizing plate is in contact with the body, and
wherein the polarizing plate, the display panel, the side surface of the sealing layer, and a portion of an upper surface of the back cover are in contact with the support portion.

16. The display device of claim 11, wherein the unit side cover includes one or more protrusions protruding to the first accommodation space.

17. The display device of claim 16, wherein the side surface of the back cover is provided with an opening pattern formed of a plurality of holes, and
wherein the protrusions have shapes corresponding to the plurality of holes in the side surface of the back cover.

18. The display device of claim 1, wherein the unit side cover is provided with at least one fastening hole for fastening with the unit side cover adjacent to an upper or lower end thereof, and
wherein the fastening hole connects the unit side covers through a wire.

19. The display device of claim 1, further comprising a thin film coating provided on a surface of the accommodation space to prevent abrasion due to contact when the display panel and the back cover are fastened.

* * * * *